(12) United States Patent
Yun

(10) Patent No.: US 6,240,331 B1
(45) Date of Patent: May 29, 2001

(54) INTEGRATED MANAGEMENT OF SEMICONDUCTOR PROCESS DATA

(75) Inventor: Jong-hyun Yun, Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/135,652

(22) Filed: Aug. 18, 1998

(30) Foreign Application Priority Data

Feb. 3, 1998 (KR) .................................................. 98/2895

(51) Int. Cl.[7] ...................................................... G06F 19/00
(52) U.S. Cl. ............................... 700/121; 700/96; 700/97
(58) Field of Search .................................. 700/121, 110, 700/109, 115, 95, 96, 104, 111, 117, 97

(56) References Cited

U.S. PATENT DOCUMENTS

| | | | |
|---|---|---|---|
| 5,497,331 | * 3/1996 | Iriki et al. | 364/468 |
| 5,668,986 | * 9/1997 | Nilsen et al. | 395/610 |
| 5,777,901 | * 7/1998 | Berezin et al. | 364/578 |
| 5,778,386 | * 7/1998 | Lin et al. | 707/200.1 |
| 5,940,300 | * 8/1999 | Ozaki | 364/468.28 |

* cited by examiner

*Primary Examiner*—Robert Beausoleil
*Assistant Examiner*—Tim Vo
(74) *Attorney, Agent, or Firm*—Jones Volentine, LLC

(57) ABSTRACT

A method for integrated management of semiconductor process data. The method is capable of easily accessing data generated in one semiconductor fabrication line, and commonly sharing and easily accessing data generated in a plurality of semiconductor fabrication lines. An integrated management system (IMS) is installed in every semiconductor fabrication lines and allows integrated management of the semiconductor process data. Each IMS is in communication with every other IMS and includes a plurality of data sets and corresponding data set modules. Then a user interface computer logs into a contacted IMS. A work environment, including a contacted data set module, is updated at the user interface computer using information from the contacted IMS. A task is then carried out at the user interface computer according to the updated work environment.

2 Claims, 4 Drawing Sheets

INTEGRATED MANAGEMENT OF SEMICONDUCTOR PROCESS DATA

BACKGROUND OF THE INVENTION

1. Field of the Invention

The present invention relates to integrated management of semiconductor process data, and more particularly, to a method for easily accessing a plurality of data sets generated in one semiconductor fabrication line, and for sharing and easily accessing additional data sets generated in additional semiconductor fabrication lines.

2. Description of the Related Art

With the rapid developments in the semiconductor industry required to achieve high density of semiconductor components per unit area in large scale integration devices, an increasing number of processes are performed on a single semiconductor wafer. As a result, an increasing amount of processing equipment are employed during fabrication of such devices. The sequentially employed equipment tends to be arranged in a group constituting a semiconductor fabrication processing line. A fabrication facility may include several such semiconductor fabrication lines.

A complete semiconductor product is typically fabricated through the following lines. In the first line, pure silicon that is to be the starting material for the semiconductor product is purified, grown and formed into wafers. In the next line, each wafer is processed so that semiconductor devices are integrated onto the surface of the wafer. In the next line, the processed wafer is subject to electrical die sorting (EDS) to determine which chips on the wafer satisfy quality control measures. In the next line, chips formed on the wafer are cut and those that satisfied quality control measures during EDS are assembled into semiconductor packaged products that can be attached to printed circuit boards. In a final line, the assembled products are tested.

Each semiconductor fabrication line has its own control system to control the equipment arranged in the line and the processes performed in the equipment. Through such control systems, the efficiency of the line can be enhanced, and appropriate actions can be taken rapidly to solve operational problems that may occur on the line.

FIG. 1 is a block diagram of a conventional semiconductor process data control system 100 for a fabrication line A. As shown in FIG. 1, the conventional semiconductor fabricating equipment control system 100 includes a plurality of semiconductor fabricating equipment 110, a plurality of equipment servers 120 for operating the semiconductor fabricating equipment 110 to precisely perform certain semiconductor fabricating processes, and host computers 130 and 135 for storing the massive amounts of process data required for specifying the process parameters for the various processes and variations, and for downloading those data into the equipment servers 120.

More particularly, the equipment servers 120 communicate with the corresponding semiconductor fabricating equipment 110 according to a Semiconductor Equipment Communication Standard (SECS) protocol on a RS-232C connection. The host computers 130 and 135 engage in two-way communication with the equipment servers 120 according to the Terminal Connection Protocol/Internet Protocol (TCP/IP) that is well known. That is, the semiconductor equipment 110, the equipment servers 120, and the host computers 130 and 135 are connected on-line via a network.

Generally, the semiconductor fabricating equipment control system 100 requires at least two host computers which have different functions. One of the computers is a process control host computer 130 and the other is a data storage host computer 135.

A data server 137 is installed in the data storage host computer 135. A plurality of data managing modules, for example software modules, 137a, 137b . . . 137n are included in the data server 137. Each of the data managing modules 137a, 137b . . . 137n treats specific data arranged in a corresponding data set. Typically, the data managing modules 137a, 137b, . . . 137n are application software program modules included in a data server program running on the data storage host computer 135.

A specific data managing module of the data server 137, e.g., 137a, may be an equipment history managing module, another, e.g. 137b, may be a statistical management module, and yet another, e.g. 137n, may be an equipment monitoring module. The equipment history managing module 137a would track the number of hours each equipment is operated or the number of lots processed by each equipment, for the purpose of checking the cleaning and preventative maintenance cycles and generating cleaning period data. Also, the equipment history managing module 137a could manage the histories of the equipment 110 itself. The statistical management module 137b checks statistics generated by combining measured data obtained from wafers after the wafers are processed in the equipment 110. The equipment monitoring module 137n would monitor the equipment operating states such as run state, down state, or idle state, and generate monitored data results, reports or displays.

A plurality of user interface (UI) computers 140a, 140b, . . . 140n and at least one O/I computer 150 are also connected on-line to the network.

The UI computers 140 are connected on-line to the semiconductor equipment control system 100 so that an analyst or an operator can receive some data from the data storage host computer 135. These received data are required for operating the equipment to perform the various fabrication processes and for analyzing causes of operational problems that may occur. The operator or analyst must load and execute a program on the UI computer 140 to retrieve data from the data storage computer 135. For example, when the operator wants to receive equipment history management data from the equipment history managing module 137a through the UI computer 140a, the operator must install and run a suitable program in the UI computer 140a or in another UI computer 140. The suitable program is a program that allows the UI computer 140a to access the equipment history managing module 137a.

For example, when the operator wants to receive statistical data, for example, through the UI computer 140b the operator must install and run a different suitable program in the UI computer 140b or in another UI computer 140. The suitable program is a program that allows the UI computer 140b to access the statistical management module 137b.

By repeatedly installing suitable programs on the UI computers 140, the operator can obtain and analyze wanted data from the plurality of data sets using the corresponding managing modules 137a, 137b . . . 137n included in the data server 137 in the data storage host computer 135.

Besides the UI computers 140, at least one operator interface (O/I) computer 150 is also installed in the semiconductor fabricating equipment control system 100 for fabrication line A. Through the O/I computer 150, the operator checks process data downloaded from the process control host computer 130 and directs processing in the semiconductor fabricating equipment 110 by sending messages to the corresponding equipment server 120.

A semiconductor fabrication line A with the semiconductor fabricating equipment control system 100 is connected on-line to another semiconductor fabrication line B. The semiconductor fabrication lines A and B can therefore share data generated in each.

For example, when a semiconductor fabrication line for processing wafers (line A) is connected on-line to an EDS line (line B) for electrically testing the wafers, wafers processed through line A are passed to line B. In the EDS line, all chips are separated into passed chips and failed chips, and the failed chips are further separated into repairable and non-repairable failed chips.

Furthermore, in this example, when data from the EDS line (line B) are communicated to the UI computer 140 on the wafer processing line (line A), causes of the defects in the preceding wafer processing line can be identified early. As a specific example, data related to the defect causes identified through the EDS line are processed by the defect analyzing module of the data server 137 installed in a host computer 135, of the EDS line. The processed results are then available for further analysis by an analyst or an operator who accesses the host computer 135 of the EDS line through a UI computer 140 of the EDS line. However, the cause of the defect arises in the preceding wafer processing line. Accordingly, the operator or analyst who actually requires the processed result is the operator or analyst involved in the wafer processing line, who is at a UI computer 140 on the wafer processing line. As a result, the operator or analyst involved in the wafer processing line accesses the data storage host computer 135 of the EDS line by installing in the UI computer 140 of the wafer processing line an application program for accessing the processed results from the defect analyzing module on the EDS line. Then the operator or analyst receives the desired data from the defect analyzing module, and then further analyzes and acts on the received data.

However, such a conventional semiconductor fabricating equipment control system has several problems.

First, in order to receive data from the plurality of data sets corresponding to a plurality of data managing modules on one semiconductor fabrication line, several application programs, each corresponding to one of the plurality of data managing modules 137a, 137b, . . . 137n, should be installed in a UI computer 140. As a result, the data from the data managing modules 137a, 137b, . . . 137n cannot undergo an integrated analysis, i.e. can not be analyzed within one application program with fewer commands than modules, and therefore cannot be easily accessed.

In addition, when an operator wants to access data in one semiconductor fabrication line through a UI computer that is part of another semiconductor fabrication line the operator must install on that UI computer a suitable application program matched to that module of the other line, and then execute it, which is cumbersome work.

SUMMARY OF THE INVENTION

It is therefore an object of the present invention to receive data from an integrated data management system without installation of a separate application program. The integrated data management system is installed in every data storage host computer of a plurality of semiconductor fabrication lines. When a certain data storage host computer is accessed through any UI computer, work environment data are downloaded into the UI computer from the accessed host computer. As a result, the work environment of the UI computer is updated to be the same as the work environment of the accessed host computer so that the data can be received from the integrated data management module without installation of a separate application.

To achieve the above and other objects and advantages of the present invention, a method for integrated management of semiconductor process data is provided. The method for integrated management of semiconductor process data includes installing into each one of a plurality of semiconductor fabrication lines a corresponding one integrated management system (IMS). Each IMS includes a plurality of semiconductor device fabrication process data sets for the one semiconductor fabrication line, and a data set module for extracting some data from a corresponding one of the plurality of data sets. The one IMS is in communication with every other IMS of every other line of the plurality of semiconductor fabrication lines. Then a user interface computer logs into a contacted IMS, and a work environment at the user interface computer, including a contacted data set module, is updated from the contacted IMS. Then, at the user interface computer, a task for controlling semiconductor device fabrication is carried out according to the updated work environment, including processing some data from a contacted plurality of semiconductor device fabrication process data sets.

In another aspect of the present invention, each IMS includes an integrated management module which is capable of integrated processing of several of the plurality of data sets, and the work environment includes a contacted integrated management module.

BRIEF DESCRIPTION OF THE DRAWINGS

The present invention is described in detail with reference to the accompanying drawings, in which.

DETAILED DESCRIPTION OF THE PREFERRED EMBODIMENTS

The present invention now will be described more fully with reference to the accompanying drawings, in which preferred embodiments of the invention are shown.

Figure 1:
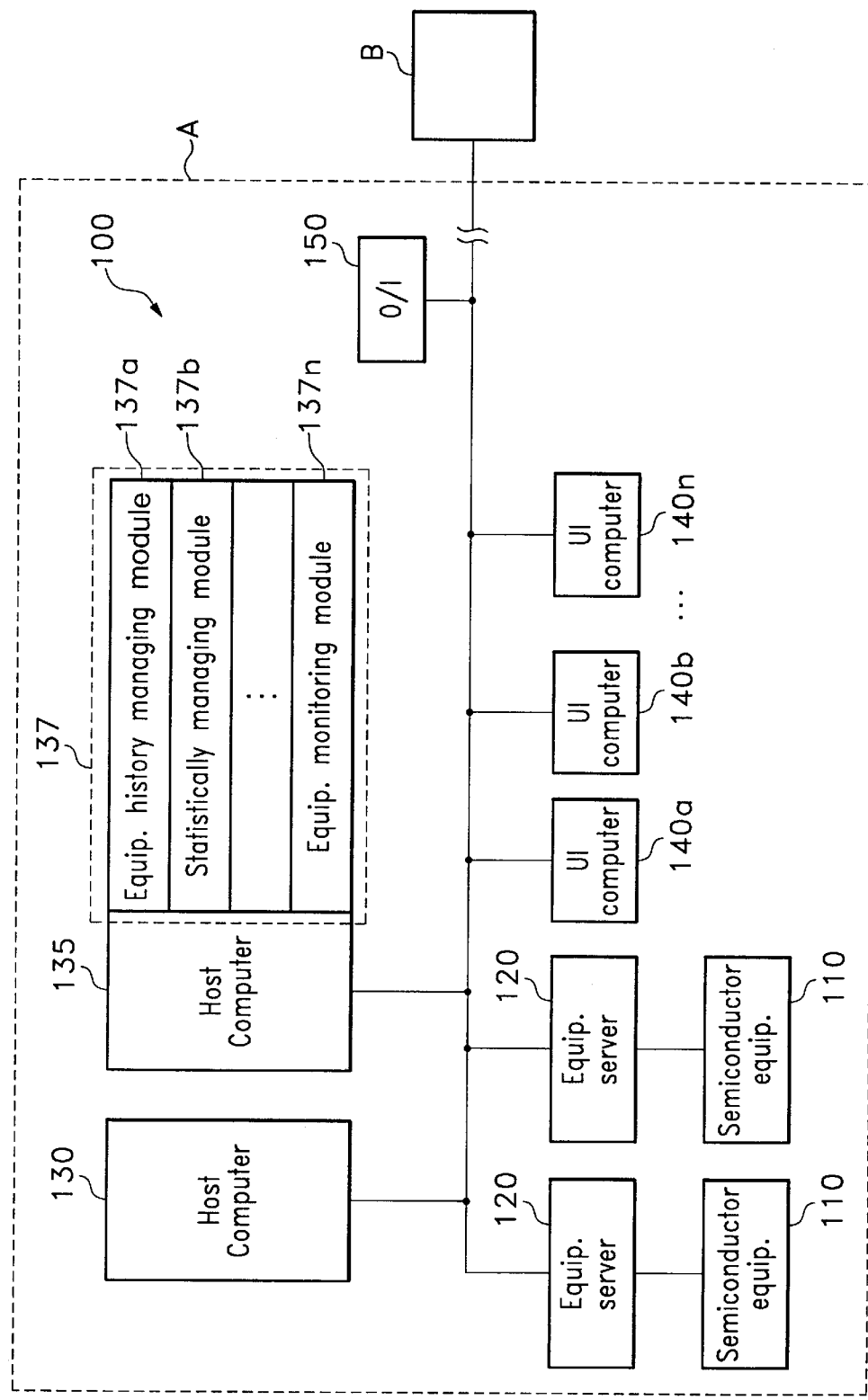
FIG. 1 is a block diagram of a conventional semiconductor fabricating equipment control system.
Figure 2:
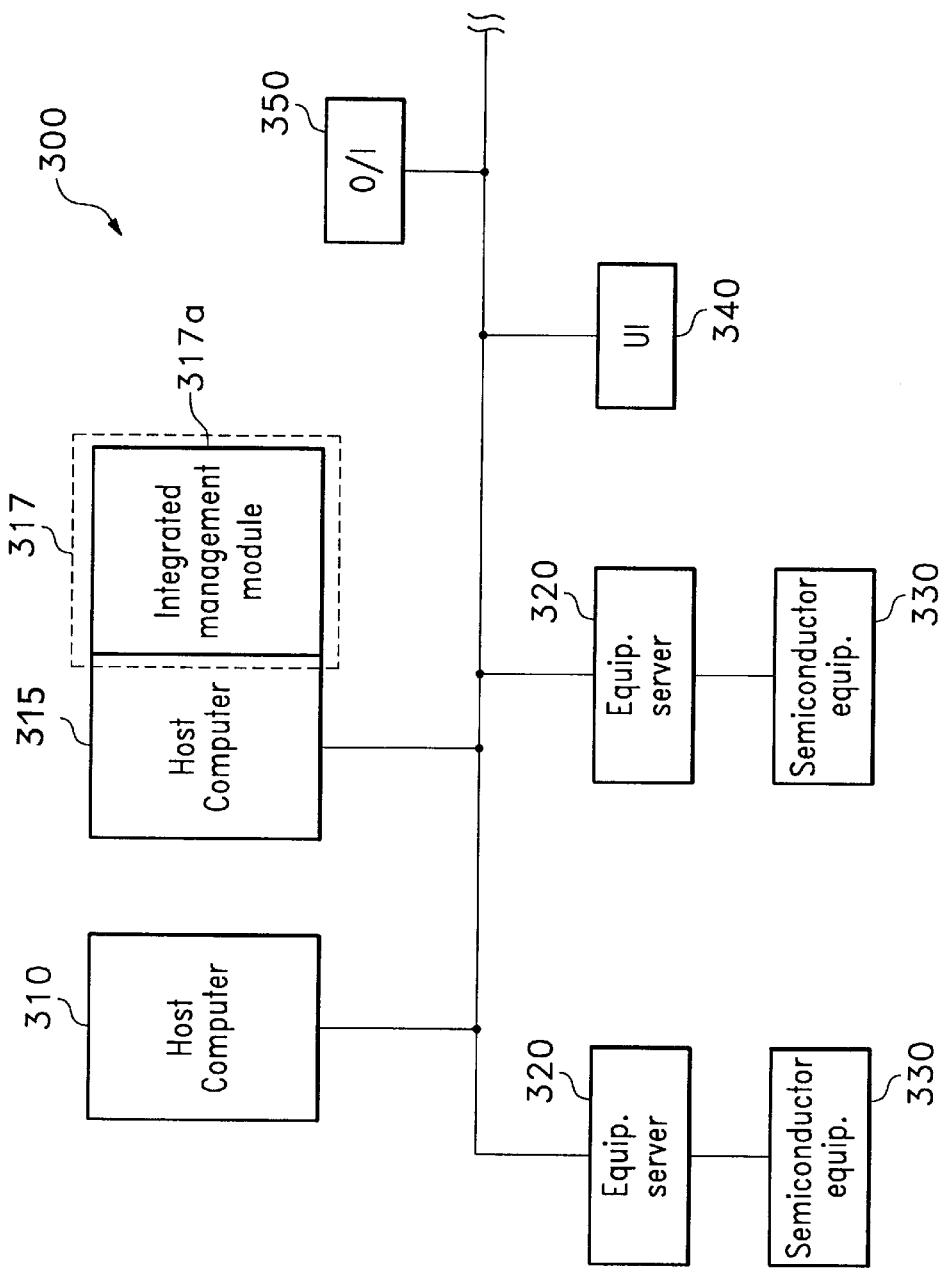
FIG. 2 is a block diagram of a semiconductor fabricating equipment control system according to the present invention.

As shown in FIG. 2, the semiconductor fabricating equipment control system 300 of the present invention includes: a plurality of semiconductor fabricating equipment 330, a plurality of equipment servers 320 for operating the semiconductor fabricating equipment 330 to precisely perform the semiconductor fabricating processes, and an integrated management system (IMS). In the preferred embodiment, the IMS includes one or more host computers 310 and 315 for storing large amounts of process data required for specifying the process parameters for the various processes and variations, and for downloading those data into the equipment servers 320. The system 300 also includes at least one user interface (UI) computer 340 and an operator interface (O/I) computer 350. The host computers 310 and 315, the equipment servers 320, the semiconductor fabricating equipment 330, the UI computer 340 and the O/I computer 350 are interconnected as an on-line network.

In the preferred embodiment, the host computers 310 and 315 communicate with the equipment servers 320, the UI computers 340, and the O/I computer 350 according to TCP/IP, but any appropriate network protocol known to those in the art can be used.

In the preferred embodiment, the host computers 310 and 315 download required process data into each equipment server 320. The equipment server 320 uploads the operating state, the operation rate, and the operation order of the semiconductor fabricating equipment 330 into the host computers 310 and 315 so that the host computers 310 and 315 are prepared for the following process. In the preferred embodiment, the equipment servers 320 communicate with the corresponding semiconductor fabricating equipments 330 according to a SECS protocol, but any appropriate protocol known to those in the art can be used.

In the preferred embodiment, the IMS of the semiconductor fabricating equipment control system according to the present invention includes at least two host computers having different functions. At least one computer is a process control host computer 310 with a database having large amounts of process data, for downloading the process data into the semiconductor fabricating equipment 330 and controlling the processes performed in the semiconductor fabricating equipment 330. At least one other computer is a data storage host computer 315 for storing measured data, fabrication information, and information regarding each processing lot generated during or after the processes performed on the lots. The reason for separate process control host computer 310 and data storage host computer 315 is to prevent overload on the process control host computer 310 due to frequent data input and output. Consequently, efficiency can be enhanced and process computer downtime due to overload can be prevented.

A data processing server 317 is installed in the IMS, for example, in the data storage host computer 315. In the data processing server 317, an integrated data management module 317a is preferably installed. The integrated data management module 317a is an integrated management program that produces several results from different data sets associated with the processing line. For example, the integrated management module 317a may calculate data related to the accumulated number of lots moved between processes and between equipment in the fabrication line by day, week, and month. Also, for example, the integrated management module 317a may register and correct the parameters for the presently operating equipment operating on each of the lots. As a further example, the integrated management module 317a may calculate statistics associated with various measured or reported data.

In other words, the integrated data management module 317a of the IMS sorts input data into data sets having various formats, stores the data sets in a predetermined area of the data storage host computer 315, performs integrated processing on the one or several data sets by a single command of an operator or an analyst, and transmits the processed results into the UI computer 340 of the operator who issues the command.

Through the integrated management module 317a, the operator can obtain desired data from the data storage host computer 315 by simply accessing the integrated data management module 317a through the UI computer 340 and requesting the wanted data. Installing a separate application program on the UI computer is not required.

The O/I computer 350 displays the process data downloaded, for example, from the host computer 310 so that the operator can recognize the process data, input a run command or a process terminating command and carry out simple data manipulation.

Such an integrated management system (IMS) is installed in the semiconductor fabricating equipment control system 300 for every semiconductor fabrication line. The plurality of the IMSs installed respectively in the plurality of semiconductor fabrication lines are connected to each other via an on-line network to commonly share data with each other and to allow easy access of the data on any line from any UI computer.

For example, by installing a data processing server program 317 on a data storage host computer 315 in the conventional semiconductor fabricating equipment control system 100, the conventional semiconductor fabricating equipment control system 100 is converted into a semiconductor fabricating equipment control system 300 with a process data integrated management system (IMS). The data processing server program 317 allows the data and modules running on a UI computer, i.e. the UI computer work environment, to be updated from the IMS. In the preferred embodiment, the data processing server program 317 includes an integrated management module 317a, which allows the UI computer work environment to compute results from several process data sets associated with one semiconductor fabrication line using fewer command line inputs by the user than is conventionally needed to access several process data sets.

Figure 3A:
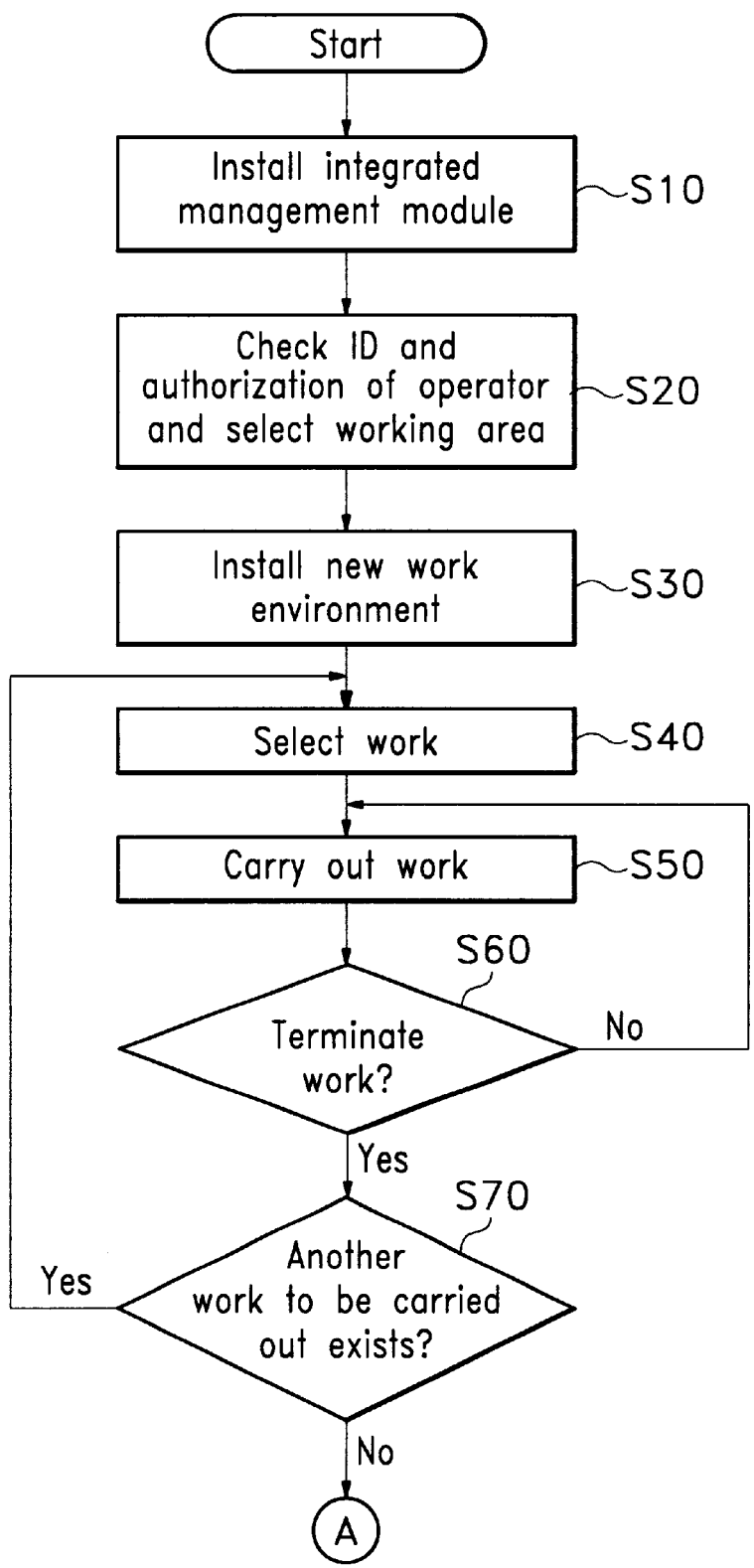
FIGS. 3A and 3B are flow charts of a method for integrated management of semiconductor process data according to the present invention.
Figure 3B:
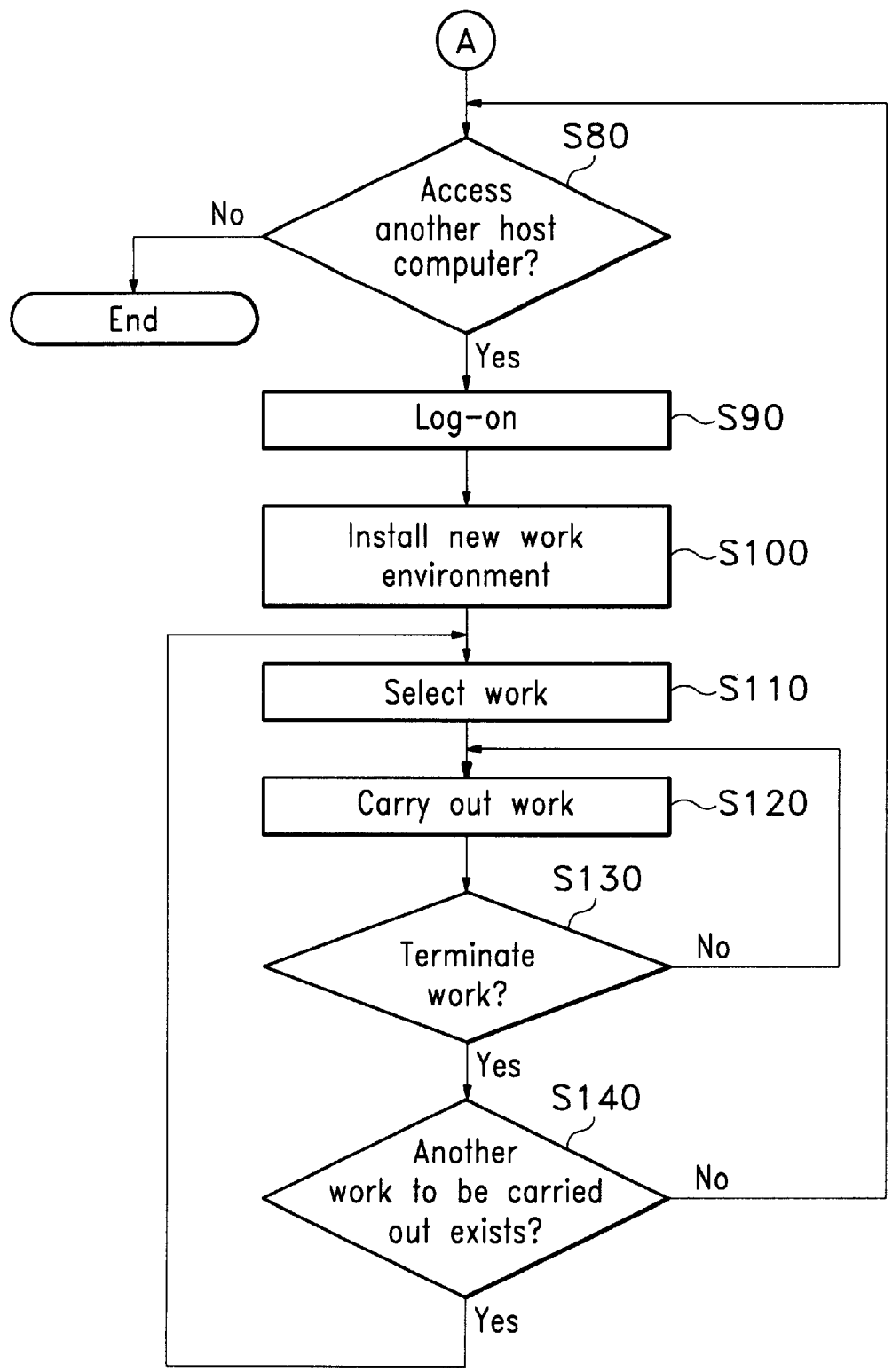

The method for integrated management of process data in a semiconductor fabricating equipment control system 300 will be described with reference to the flow charts of FIGS. 3A and 3B.

In order to more easily manage a plurality of process data sets spread over a plurality of semiconductor fabrication lines which are interconnected on-line, an integrated data management system (IMS) is installed in every semiconductor fabricating equipment control system formed in the plurality of semiconductor fabrication lines. Preferably, to integrally manage a great number of process data sets for each individual semiconductor fabrication line, the IMS includes an integrated management module 317a (S10).

Note that the preferred integrated data management system (IMS) provides the UI computer installed in the semiconductor fabrication line with a work environment that is suitable for all the data sets that describe the characteristics of that semiconductor fabrication line. For example, a wafer processing line and a package assembling line have different kinds and numbers of equipment installed thereon and different kinds, numbers and periods of processes to be performed therein. Accordingly, the integrated data management system (IMS) to be installed in the respective fabrication line has characteristics that are suitable for the respective fabrication line.

The next part of the method is for a user at a UI computer to log into the appropriate IMS. In the preferred embodiment, the logging includes entering and checking the identification code (ID) of the operator, entering and checking the password for identifying the operator and authorizing the work (i.e., the set of tasks) to be performed by that operator, and selecting the fabrication line with the data required by the operator (S20).

When the checks of step S20 are satisfied, the user's UI computer 340 is connected to the appropriate IMS (IMS I) of a control system 300. The connected IMS (IMS I) then updates the work environment on the UI computer 340 by downloading a work environment suitable for the semiconductor fabrication line selected. Thereby, a new work environment is installed in the UI computer 340 (S30).

After the new work environment is installed, the operator selects a task of the work to carry out (S40). Then the UI computer carries out that task of the work (S50). During the carrying out, data suitable for the selected task is retrieved by the UI computer from the connected IMS (IMS I). In the preferred embodiment, with an integrated data management module 317a, data resulting from combining and analyzing data from two or more data sets of the fabrication line may be retrieved by the UI computer without extra effort by the user.

After the selected task is started, the operator decides whether to terminate the task, for example, because the task is completed (S60). After the task is terminated, the user determines whether there is another task to be carried out using the same connected IMS (IMS I) (S70). If it is determined that there is another task to be carried out in the same, connected IMS (IMS I), the steps are repeated starting at selecting a task S40.

If it is determined that there is not any more work to be carried out in the connected IMS (IMS I), the operator determines whether to access data in another, different IMS (IMS II) of another semiconductor fabrication line (S80). If it is determined that there is no data to be accessed in the different IMS (IMS II), the method ends. That is, management of the fabrication process is terminated and the UI computer is logged off the connected IMS (IMS I).

If the operator determines to access data in the different IMS (IMS II), the UI computer is logged off the connected IMS (IMS I) and the UI computer is logged into the different IMS (IMS II) (S90). At this time, the different IMS (IMS II) updates the work environment data in the UI computer 340 so that an updated work environment is established in the UI computer 340. Thereby, a new work environment is installed in the UI computer 340 (S100). Then, the operator selects a wanted task in the different IMS (IMS II) through the UI computer 340 having the updated work environment (S110). Then the UI computer carries out that task of the work (S120). During the carrying out, data suitable for the selected task is retrieved by the UI computer from the different IMS (IMS II). In the preferred embodiment, with an integrated data management module 317a, data resulting from combining and analyzing data from two or more data sets of the different fabrication line may be retrieved by the UI computer without extra effort by the user.

If the task is completed in the different IMS (IMS II), the operator accordingly determines to terminate the work (S130). It is determined whether there is another task to be carried out in the different IMS (IMS II) (S140). If it is determined that there is not another task to be carried out in the different IMS (IMS II), the method returns to determining whether to access data in another, still different IMS (IMS III) of still another semiconductor fabrication line (S80).

When the IMS of the preferred embodiment is installed in every semiconductor fabrication line, integrated analysis of data in one semiconductor fabrication line and enhanced access and easy data sharing between the plurality of semiconductor fabrication lines are provided.

This invention has been described above with reference to the aforementioned embodiments. It should be evident, however, to those of skill in the art that many alternatives, modifications and variations can be made without departing from the spirit and scope of this invention. Accordingly, it is intended that the present invention embrace all alternatives, modifications and variations that fall within the scope of the appended claims and their equivalents.

What is claimed is:

1. A method for integrated management of semiconductor process data comprising:

installing into each one of a plurality of semiconductor fabrication lines a corresponding one integrated management system (IMS) including a plurality of semiconductor device fabrication process data sets for the one semiconductor fabrication line, and a data set module for extracting certain data from a corresponding one of the plurality of data sets, the one IMS being in communication with every other IMS of every other line of the plurality of semiconductor fabrication lines;

logging a user interface computer into a contacted IMS;

updating a work environment at the user interface computer from the contacted IMS, the work environment including a contacted data set module; and carrying out, at the user interface computer, a task for controlling semiconductor device fabrication, including processing some data from a contacted plurality of semiconductor device fabrication process data sets according to the updated work environment;

wherein said logging the user interface computer into the contacted IMS comprises checking an identification (ID) of an operator, authorizing the operator to perform a set of tasks, and selecting one line of the plurality of semiconductor fabrication lines for logging into a respective one IMS, and wherein said method further comprises:
selecting a task, before said carrying out the task for controlling semiconductor device fabrication;
determining whether there is another task to carry out with the one line, after said carrying out the task for controlling semiconductor device fabrication;
if there is another task, returning to said selecting a task;
if there is not another task, determining whether to log said user interface computer into a different IMS of a different line of the plurality of semiconductor fabrication lines; and
if it is determined to log into the different IMS,
logging the user interface computer into the different IMS, and
updating a different work environment at the user interface computer from the different IMS.

2. The method of claim 1, wherein each IMS includes an integrated management module which is capable of integrated processing of several of the plurality of data sets, and the work environment includes a contacted integrated management module.

* * * * *